United States Patent [19]
Liou et al.

[11] Patent Number: 4,789,967
[45] Date of Patent: Dec. 6, 1988

[54] RANDOM ACCESS MEMORY DEVICE WITH BLOCK RESET

[75] Inventors: Jiunn-Yau Liou, San Jose; May-Lin Lee, Cupertino; Moon S. Kok, Milpitas; James Yu, San Jose; Aloysius T. Tam, Sunnyvale, all of Calif.

[73] Assignee: Advanced Micro Devices, Inc., Sunnyvale, Calif.

[21] Appl. No.: 908,072

[22] Filed: Sep. 16, 1986

[51] Int. Cl.$^4$ .................................................. G11C 7/00
[52] U.S. Cl. ...................................... 365/189; 365/230
[58] Field of Search ................. 365/49, 189, 230, 233, 365/218

[56] References Cited

U.S. PATENT DOCUMENTS

| | | | |
|---|---|---|---|
| 4,168,541 | 9/1979 | DeKarske | 365/230 |
| 4,545,038 | 10/1985 | Bellay et al. | 365/230 |
| 4,559,618 | 12/1985 | Houseman et al. | 365/49 |
| 4,636,982 | 1/1987 | Takemae et al. | 365/149 |

Primary Examiner—Joseph A. Popek
Attorney, Agent, or Firm—Mark A. Haynes

[57] ABSTRACT

An apparatus for storing data for read and write access receiving reset control signals, comprising a plurality of storage blocks, each block including an array of memory units for storing a unit of data is provided that is reset along storage block boundaries. A reset control means, coupled to receive the reset control signals which identify at least one of the storage blocks, is included for generating block reset signals. A means, coupled to the memory units in each storage block and to receive the block reset signals, for resetting the identified block of memory to 0.

20 Claims, 11 Drawing Sheets

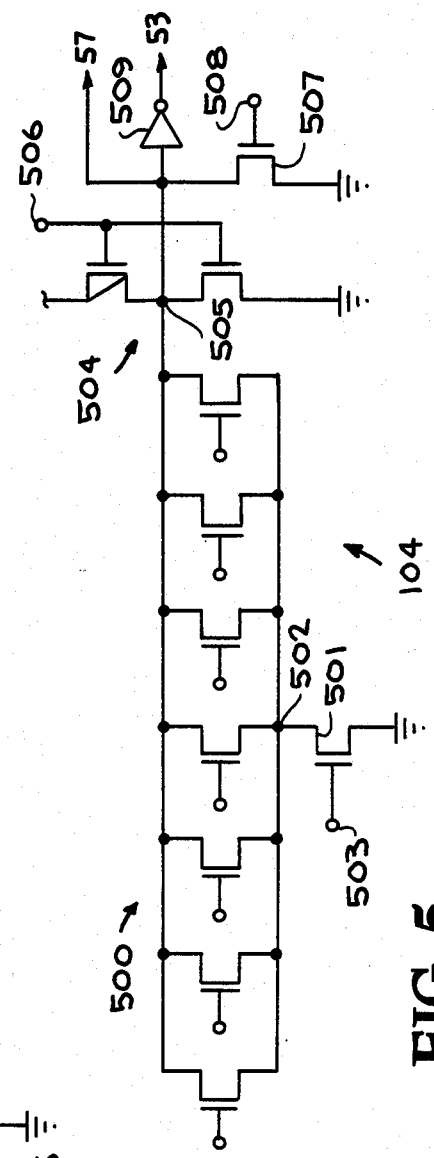
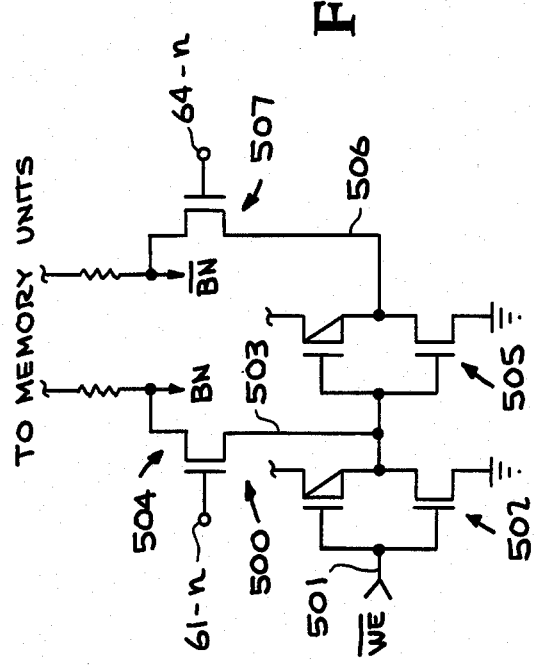
FIG. 2B
FIG. 5

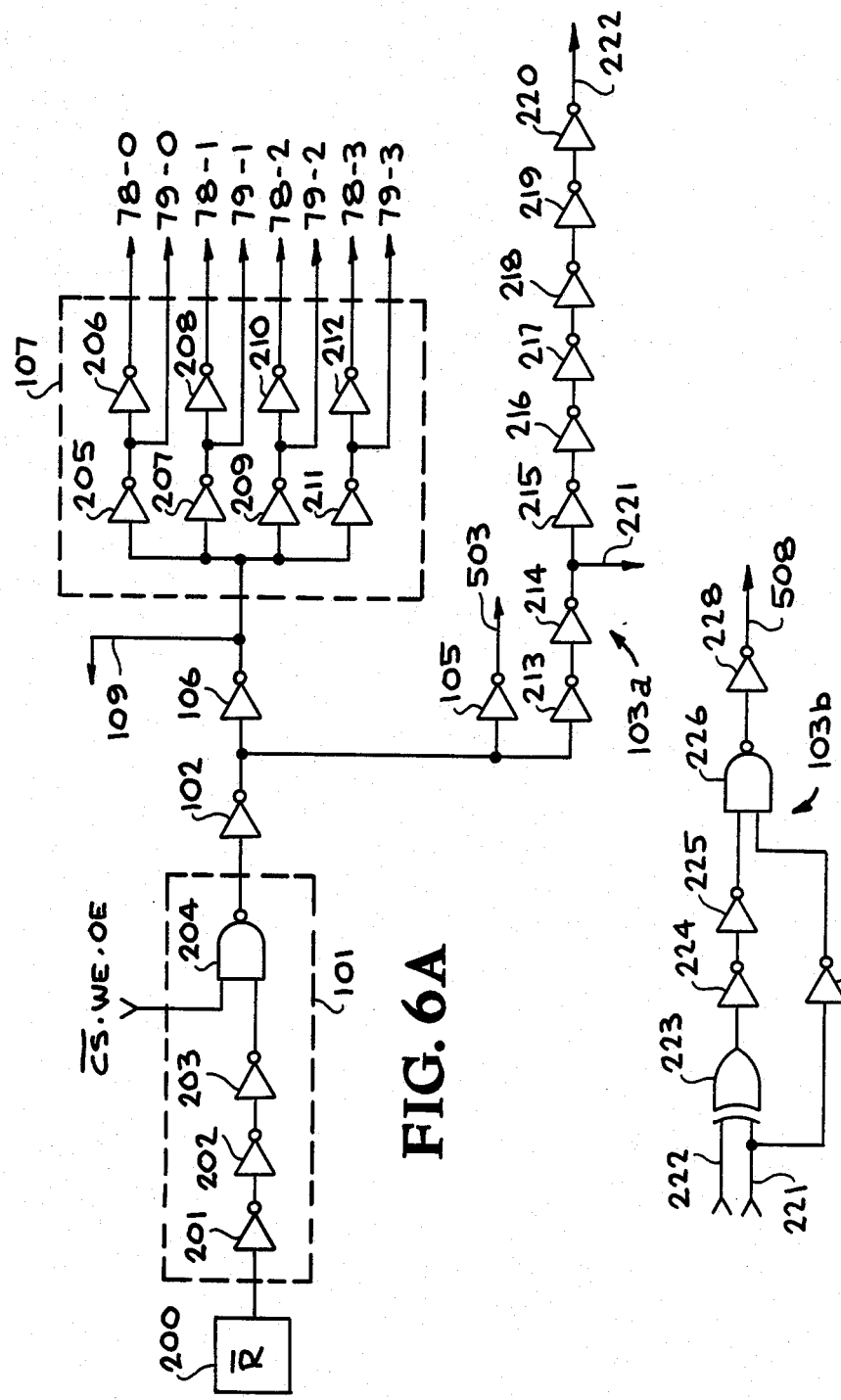

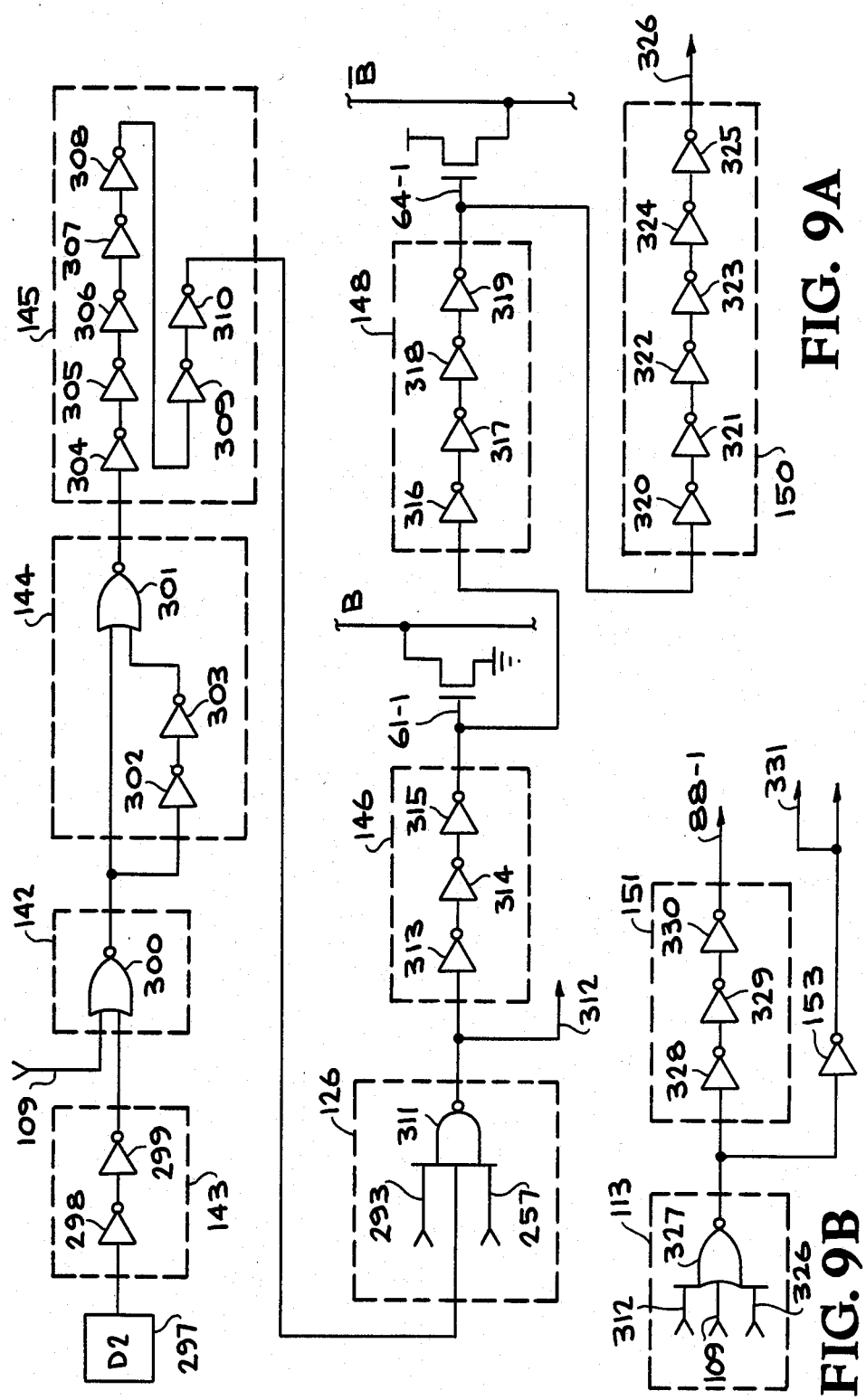

RANDOM ACCESS MEMORY DEVICE WITH BLOCK RESET.

FIELD OF THE INVENTION

The present invention relates to the set and reset functions in random access memory integrated circuits.

BACKGROUND OF THE INVENTION

In the prior art, a high performance read/write, random access memory device such as the AMD Am9150, incorporates a set or reset feature which will switch the entire contents of the memory to a single logical value in response to control signals supplied to the chip.

The term "set" usually refers to the operation of switching the contents to a logical one; while "reset" usually refers to the operation of switching the contents to a logical zero. In this application the term "reset" will refer to either of these operations.

The prior art is typified by the 1,024×4 high speed static read/write RAM sold by Advanced Micro Devices, Inc., designated the Am9150. The Am9150 includes a storage matrix that is organized into four bit blocks, each bit block storing 1,024 units of data in a 64×16 bit array. Upon assertion of the reset control signals, the entire contents of all four bit blocks is reset to zero. Typically, a large current spike is generated upon reset when the entire array of memory units is discharged. An external bypass capacitor is typically connected to the chip socket in order to attenuate the current spike.

The functionality of the reset feature, however, is limited by the fact that the entire contents of the memory device is reset. There are applications of memory devices in which it is desirable to reset only portions of the memory device. Therefore, to increase the functionality of a memory device, a more flexible reset feature is needed.

In addition, it is desirable to minimize current surges in delicate circuits.

SUMMARY OF THE INVENTION

The present invention provides a memory device organized into a plurality of memory blocks, each memory block including an array of memory units for storing a unit of data that is resettable along memory block boundaries.

Accordingly, the present invention can be characterized as an apparatus for storing date for read and write access receiving reset control signals, comprising a plurality of storage blocks, each block including an array of memory units for storing a unit of data. A reset control means, coupled to receive the reset control signals which identify at least one of the storage blocks, is included for generating block reset signals. A means, coupled to the memory units in each storage block and to receive the block reset signals, for resetting the identified block of memory to a desired value such as logical 1 or 0, is provided.

In another aspect, the present invention includes sequential control logic in communication with the reset control means for temporally staggering the generation of block reset signals for individual storage blocks. By temporally staggering the reset of separate storage blocks in the memory apparatus, the current spike discharged when resetting the memory units is reduced.

BRIEF DESCRIPTION OF THE DRAWINGS

FIG. 2B shows an alternate embodiment of the bit line pull-up or pull-down transistors for dynamic selection of reset value.

FIG. 5 illustrates a circuit for detecting address changes modified according to the present invention.

FIGS. 6A and 6B illustrate a logic diagram of a first portion of the reset control circuit receiving as one input a reset control signal.

FIGS. 9A and 9B illustrate a logic diagram of a fourth portion of the reset control circuit receiving as an input a third input/output signal identifying a block for reset.

DETAILED DESCRIPTION OF THE INVENTION

Figure 1:
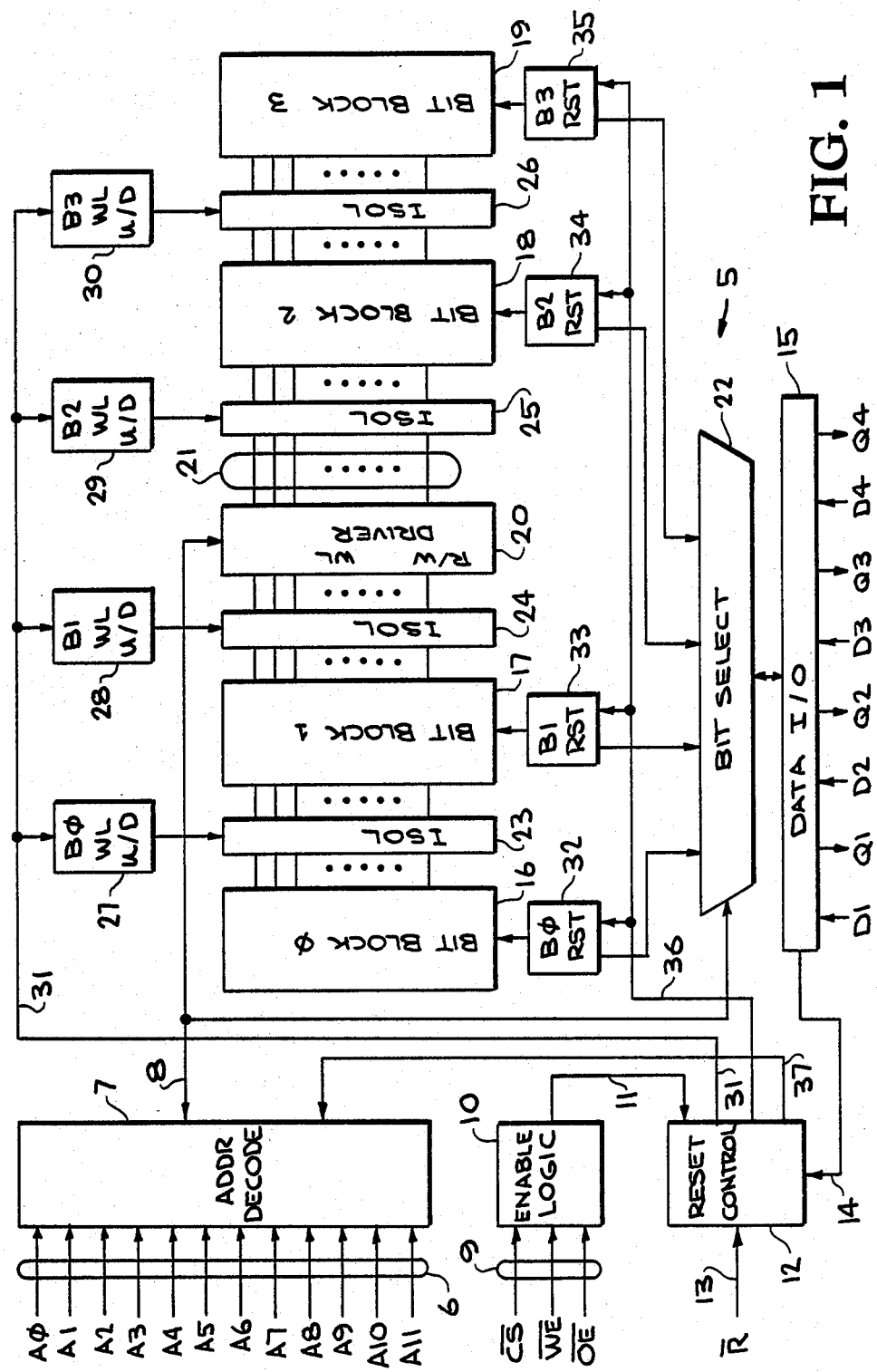
FIG. 1 is a block diagram of a preferred embodiment of the present invention.

With reference to the figures, a detailed description of a preferred embodiment of the present invention is provided. FIG. 1 illustrates a block diagram of a static read and write random acces memory device, generally designated by the reference numeral 5, implementing the block selectable reset feature of the present invention. The static RAM 5 shown in FIG. 1 implements a 4096×4 device storing 4096 4-bit words for random access read and write functions. The RAM 5 receives address bits A0–A11 at corresponding inputs 6. The address inputs 6 are connected to address decode logic 7 which generates word and bit select signals on line 8. The word and bit select signals on line 8 identify a selected one of the 4096 cells for read and write access.

The static RAM 5 further includes means for receiving chip control signals at inputs 9. The chip control signals include a chip select signal $\overline{CS}$, a write enable signal $\overline{WE}$, and an output enable signal $\overline{OE}$ for supply to chip enable logic 10. For simplicity, all of the connections to the chip enable logic 10 are not shown in FIG. 1, except that across line 11, the enable logic communicates with reset control circuit 12. It is well understood in the art how the normal function of ship enable logic works.

As mentioned above, the RAM 5 includes reset control logic 12 receiving reset control signals, including a reset signal $\overline{R}$ on line 13 and line 14 which identifies blocks of memory to be reset during the reset function.

The chip 5 includes data buffers 15 providing one word-width data inputs D1, D2, D3 and D4 and one word-width data outputs Q1, Q2, Q3 and Q4.

The random access memory device 5 includes four storage blocks, bit block zero 16, bit block one 17, bit block two 18 and bit block three 19. Each bit block includes an array of 4096 memory units each storing a bit of data. The organization of the bit blocks is shown in detail in FIG. 2. During read and write functions, each bit block is accessed in response to the word and bit select signals from line 8. The word select signals are supplied to a read/write word line driver 20 which enables a selected one of a plurality of word line 21. The plurality of word lines according to the present invention are implemented as shown in FIG. 3. Each word line, when enabled, is provided to each of the four bit blocks, as illustrated in FIG. 1.

The bit select signals from line 8 are supplied to bit select logic 22. In the preferred embodiment, each bit block is organized as an array of 128×32 memory units. Therefore, the plurality of word lines 21 includes 128 word line signals. In response to a given word line signal, each bit block supplies 32 bits in parallel to the bit select logic 22. The bit select logic then selects one of 32 bits in response to the bit select signals from line 8 from each of the four bit blocks to form a 4-bit word for supply to the data buffers 15.

According to the present invention, in order to reset the memory device along bit block boundaries, means for isolating each bit block along a word line is provided. Accordingly, a first isolating means 23 isolates bit block zero 16 from bit block one 17; a second isolating means 24 is included for isolating bit block one 17 from the read/write word line driver 20; a third isolating means 25 is included for isolating the bit block two 18 from the read/write word line driver 20; and a fourth isolating means 26 is included for isolating bit block two 18 from bit block three 19 along the word lines. By isolating the bit blocks along word lines, the array of memory units in a given bit block can be activated without interfering with the states of the memory units in adjacent bit blocks. The circuits utilized in isolating the bit blocks along the word lines are shown in FIG. 3.

In addition to the isolating means, the chip 5 includes bit block word line up/down drivers for use during reset. Accordingly, a bit 0 word line up/down driver 27 is included for pulsing the word lines connected to bit block 0 in response to a reset control signal. Similarly, bit 1 word line up/down driver 28, bit 2 word line up/down driver 29, and bit 3 word line up/down driver 30 are included. Each word line up/down driver communicates with reset control logic across line 31.

The RAM 5 further includes bit block reset drivers which during reset set the memory units within a given bit block to a selected value in conjunction with the word line up/down drivers. Accordingly, a bit 0 reset driver 32, a bit 1 reset driver 33, a bit 2 reset driver 34 and a bit 3 reset driver 35 are included. In the preferred embodiment, each bit line B is matched with a corresponding complemented bit line $\overline{B}$ that is driven as well by the bit line driver to a selected value during reset. Each of the bit line reset drivers 32-35 communicates with reset control logic across line 36. The circuit for implementing the reset drivers is shown in FIG. 2.

The reset control logic 12 communicates across line 37 with the address decode logic 7 in order to prevent attempted access to the memory array during reset, as described with reference to FIGS. 4 and 5. The static random access memory device 5 shown in FIG. 1 performs normal read and write functions when the reset control input is high and begins the reset process when the reset control input 13 goes low.

Reset of a particular bit block is not only controlled by the reset control input 13, but also controlled by data inputs D1-D4, input line D1 identifying bit block 0 for reset, input line D2 identifying bit block 1 for reset, input line D3 identifying bit block 2 for reset and input line D4 identifying bit block 3 for reset. In this manner, the apparatus 5 is able to reset any combination of bit blocks identified by the data inputs D1-D4 through the data IO buffer 15.

In addition, the reset control logic 12 includes means for temporally staggering the reset control signals for individual bit blocks in order to reduce peak surging current during reset.

In operation, the reset process is outlined as follows.
I. When the reset control input 13 goes low, it will:
  A. Disable the effect of the address decoder 7.
  B. Isolate each bit block word line through the corresponding isolating means.
  C. Direct the 4-bit data input signal across line 14 to the reset control circuit.
II. If D1 is low, then:
  A. Disable reset of bit block 3, bit block 2 and bit block 1 in order to avoid large surging current.
  B. Begin the reset of the memory units in bit block 0 with the following steps:
    1. Pull down all bit lines of bit block 0 in the B0 reset circuit 32.
    2. Pull up the word lines in bit block 0 slowly using the word line up/down driver 27.
    3. Pull up the complemented bit lines in the B0 reset driver 32.
    4. Pull down the word line of bit block 0.
    5. Enable and start the reset cycle of the next bit block identified by the input signals D2-D4, following the same steps outlined above.
III. If D1 is high and D4 is low, then the reset control logic 12 will start the reset of bit block 3 directly. If both D1 and D4 are high and D2 is low, then the reset control logic 12 will begin reset of bit block 1 directly, etc.
IV. When the reset is complete, the reset control line 13 will go high to produce a pulse on line 37 which will charge up all bit lines, enabling the address decoder 7 once again.

Figure 2A:
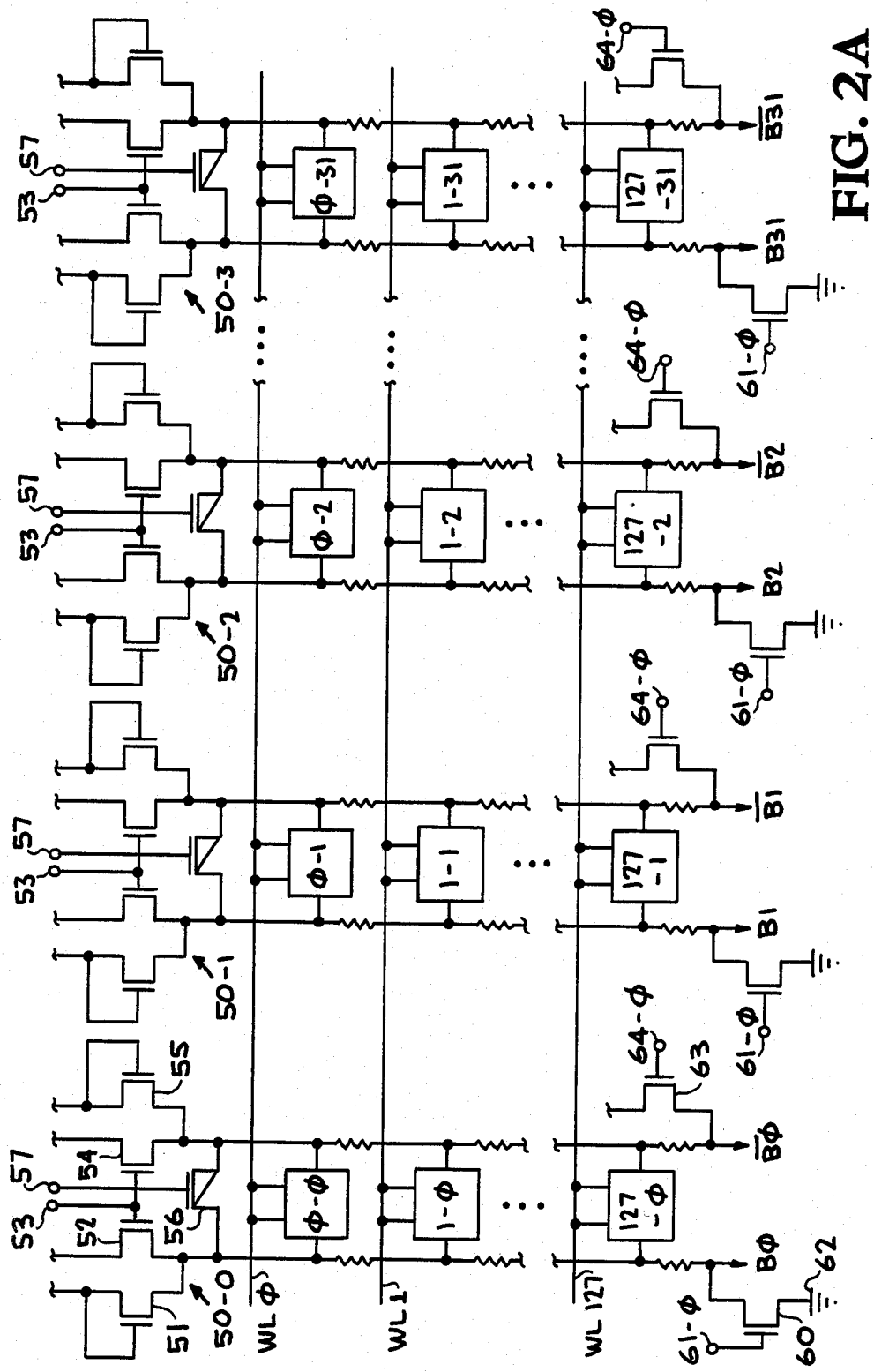
FIG. 2A illustrates the organization of a memory block including an array of memory units such as could be implemented in the embodiment shown in FIG. 1.
Figure 3:
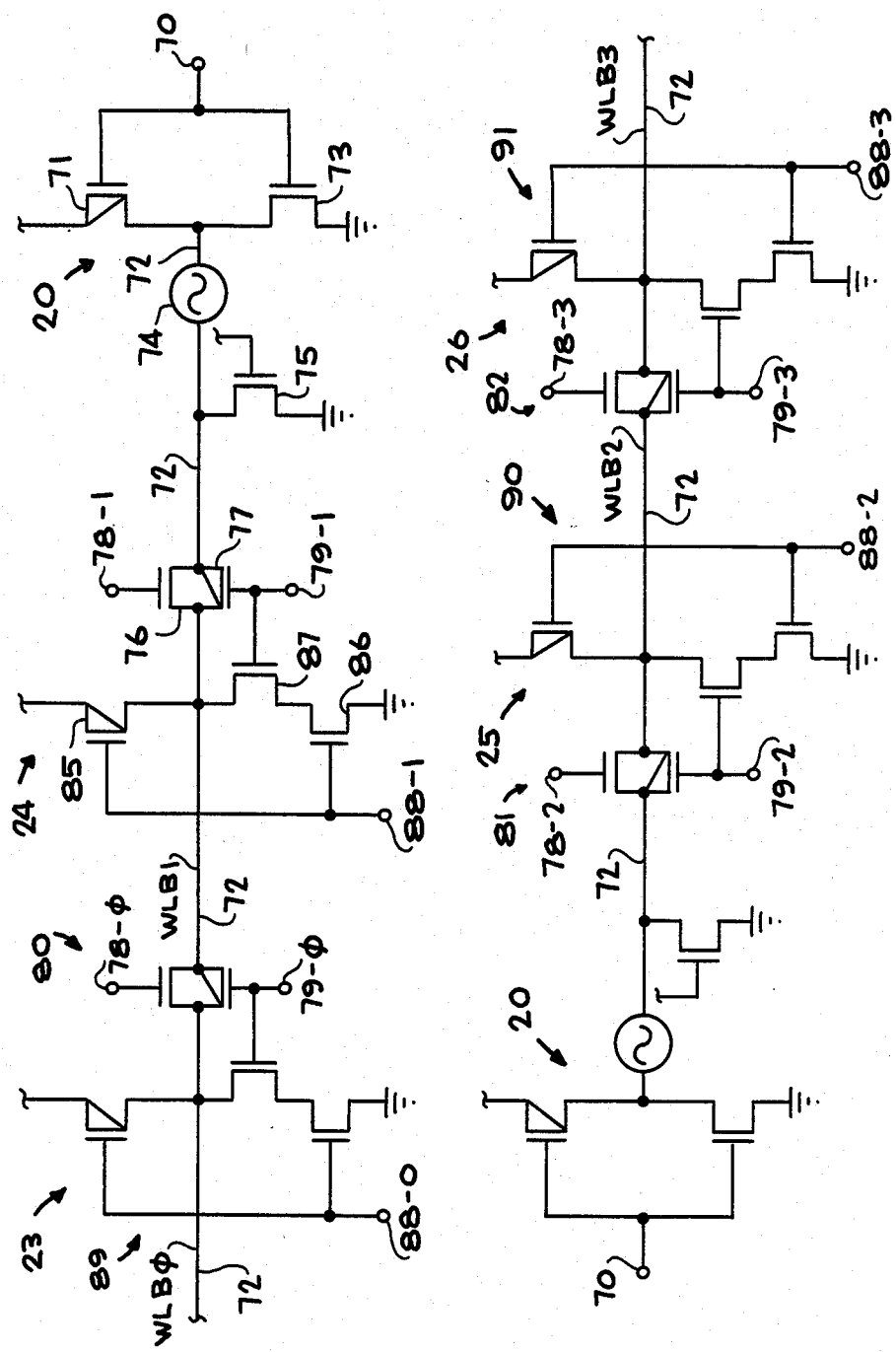
FIG. 3 shows a preferred implementation of the word line isolation and the word line pull-up/pull-down circuit used in the implementation shown in FIG. 1.

FIG. 2A illustrates array of memory units in a bit block, such as bit block 0. As dicussed above, in the example provided, the bit blocks are implemented as an array of 128×32 memory units providing bit 0 of a 4-bit word. The rows of the array designated word lines are enabled by word lines WL0-WL127, as labeled along the left side of the figure. The 32 bits provided as outputs to the bit select logic include B0-B31 and the respective complements $\overline{B0}$-$\overline{B31}$, as labeled along the bottom of the figure. Each of the memory units is addressed by a word line and a bit line. Thus, memory unit 0-0 is enabled by word line 0 and supplies outputs on bit lines B0 and $\overline{B0}$. Similarly, memory unit 0-1 is enabled by word line 0 and provides outputs on bit lines B1 and $\overline{B1}$. Memory unit 127-31 is enabled by word line 127 and provides outputs on bit lines B31 and $\overline{B31}$.

Each of the respective bit lines includes bit line pull-up and equalizer circuits 50-0, 50-1, 50-2 and 50-3, respectively. The bit line equalizer and pull-up circuits are typified by the circuit 50-0. It includes a first channel CMOS transistor 51 having its gate and source connected to $V_{CC}$ and its drain connected to bit line B0. In addition, a second N-channel transistor 52 having its gate connected to receive signal 53, its source connected to reference voltage source $V_{CC}$ and its drain connected to the bit line B0 is included. A corresponding third N-channel transistor 54 having its gate connected to receive the signal 53 and its source connected to $V_{CC}$ and its drain connected to the complement bit line $\overline{B0}$. Likewise, a diode connected N-channel transistor 55 having its source and gate connected to $V_{CC}$ and its drain connected to the complement bit line $\overline{B0}$ is included. An equalizer P-channel transistor 56 is included having its gate 57 connected to a word line equalizer signal 57 and its drain connected to the B0 bit line and its source connected to the complement $\overline{B0}$ line. Each of the bit line pull-up and equalizer circuits 50-0, 50-1, 50-2, 50-3 are identical and they are not separately described. The bit line pull-up signal 53 and the bit line equalizer signal 57 are connected in common to each of the bit lines and generated as shown in FIG. 5.

The memory units 0-0 through 127-31 are identical CMOS standard memory units providing true and complement ouputs as are well known in the art.

Also shown in FIG. 2A are the reset drivers for each of the bit lines corresponding to the bit block 0 reset driver 32 shown in FIG. 1. The reset drivers, in order to set the true bit line B to 0 in the embodiment shown, include a first CMOS transistor 60 having its drain connected to the bit line B0, its gate connected to a bit line pull-down signal 61 and its source connected to ground 62. When the bit line reset signal 61 goes true, bit line B0 is pulled low. In addition, a corresponding pull-up circuit is provided for the complement line $\overline{B0}$ including a pull-up transistor 63 having its gate connected to a pull-up control 64 and its drain connected to $V_{CC}$ and its source connected to the bit line $\overline{B0}$.

Each of the bit lines B0–B31 and $\overline{B}$–$\overline{B31}$ include corresponding pull-down and pull-up transistors responsive to the true pull-down signal 61 and a complement pull-up signal 64. Accordingly, each one is not described separately. However, this is clearly shown in the figure.

Figure 4A:
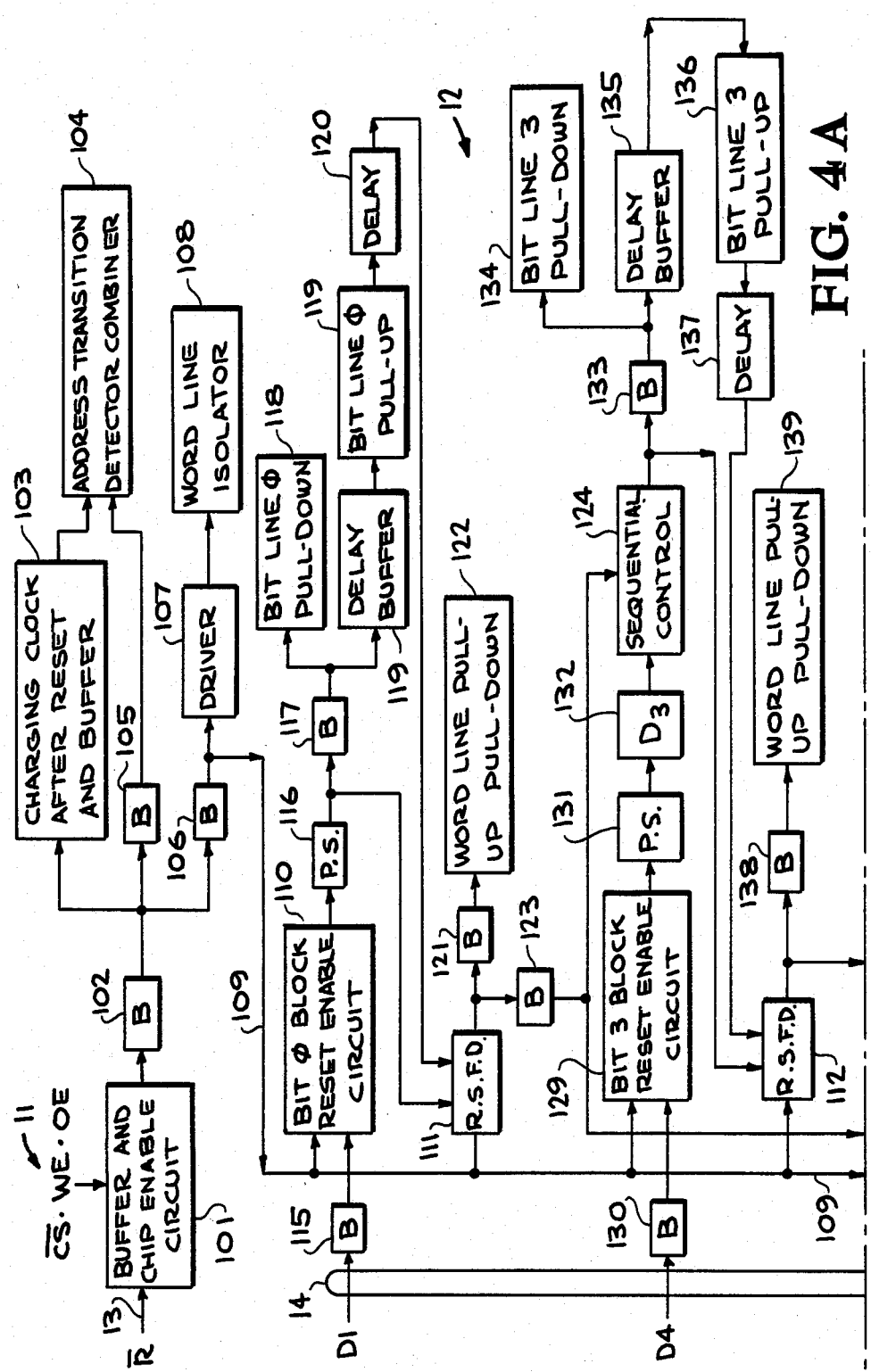
FIGS. 4A and 4B show a block diagram of a reset control circuit according to the present invention.
Figure 4B:
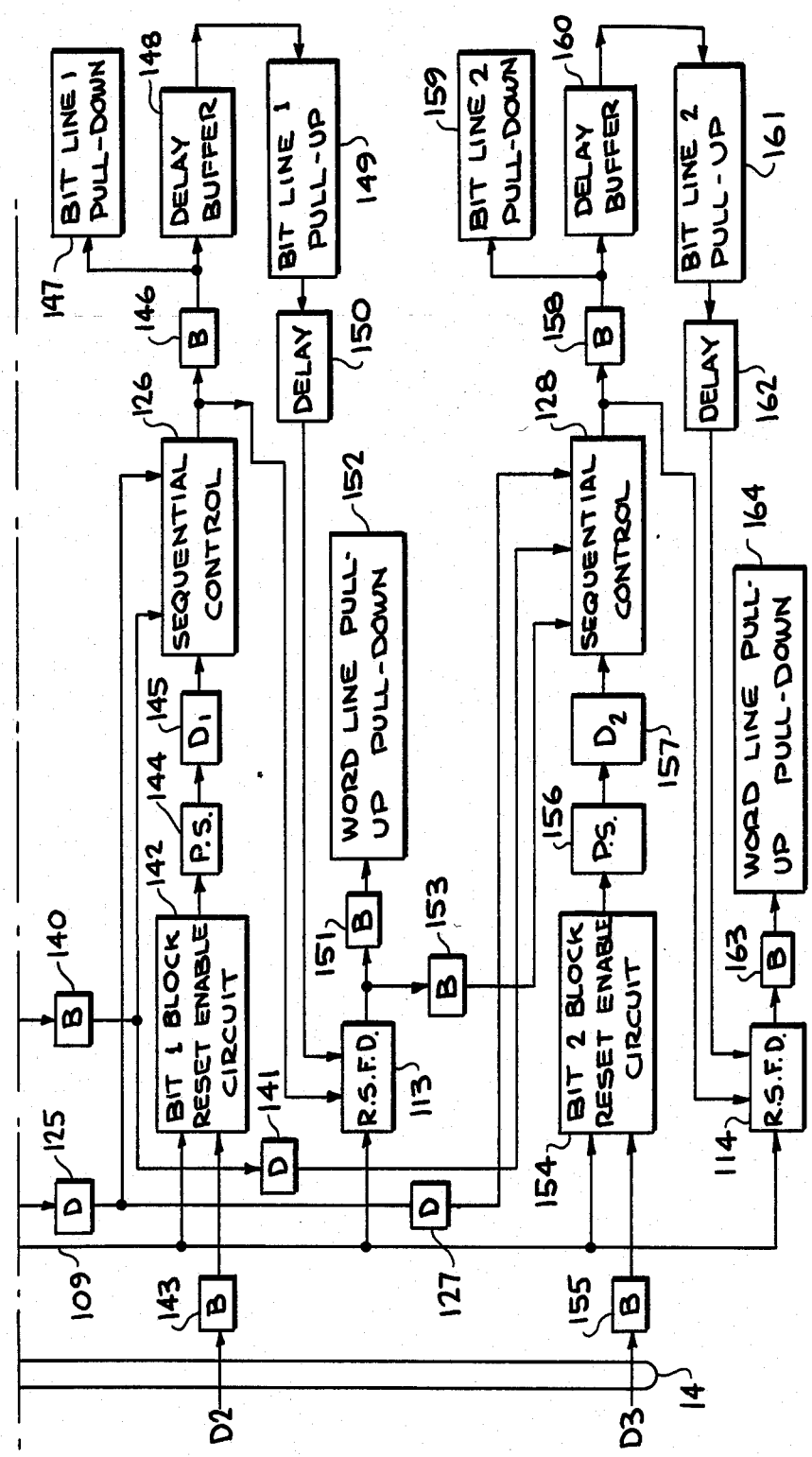

FIG. 2B illustrates an alternate embodiment of reset drivers 500 for each of the bit lines Bn and complement bit line $\overline{Bn}$ which provides for dynamically selecting the reset value to be either 0 or 1 in response to signal, during reset, the signal on line 501, which is a function of $\beta_i$ (i=1, 2, 3 . . . n) [as shown in FIG. 4] and said external input control signal is supplied through an inverter 502 to line 503 to set the value of the voltage at the source of the reset driver transistor 504. The reset driver transistor 504 has its drain connected to the bit line Bn and its gate connected to the control signal 61-n which corresponds to the bit line pull-down signal 61 discussed above. The signal at the output of the first inverter 502 is supplied to a second inverter 505 to generate an output signal on line 506 that sets the value of the voltage at the source of the reset driver transistor 507. The drain of the reset driver transistor 507 is connected to the complement bit line $\overline{Bn}$ and the gate is connected to the signal 64-n corresponding to the bit line pull-up signal discussed above. As the signal on line 501 changes, the reset driver transistors 504 and 507 become alternatively pull-up transistors or pull-down transistors. Signals 61-n and 64-n are generated as described below.

FIG. 3 illustrates implementation of the read/write word line driver 20, isolation means 23, 24, 25 and 26 and the word line up/down driver 27, 28, 29 and 30 for a single word line, which implementation is duplicated in each word line WL0–WL127.

The word line driver 20 corresponds to block 20 in FIG. 1. It includes means for receiving a signal on line 70 for enabling or diabling the word line. The driver includes a P-channel CMOS transistor 71 having a source coupled to $V_{CC}$, a drain coupled to the word line 72 and a gate coupled to the control signal 70. Further, an N-channel CMOS transistor 73 has a gate connected to the control signal 70, a drain coupled to the word line 72 and a source connected to ground. When the control signal 70 is low, transistor 71 is turned on, charging the word line 72 to $V_{CC}$. When the control signal 70 is high, transistor 73 is enabled, discharging the word line 72 to ground.

Word line 72 is connected through a fuse 74 to the drain of transistor 75. The gate of transistor 75 is connected to $V_{CC}$ and its source connected to ground.

The word line 72 is further connected to the isolating means 24, isolating the word line through bit block 1 from the word line driver 20. The isolating means includes the N-channel transistor 76 having its drain connected to the word line 72 on the driver 20 side, and its source connected to the word line 72 on the bit block side. In addition, a P-channel CMOS transistor 77 is included having its source and drain connected respectively to the source and drain of the N-channel CMOS transistor 76. The gate of the channel CMOS transistor 76 is connected to a first isolation control signal 78-1 and the gate of the P-channel transistor 77 is connected to a second isolation control signal 79-1. When the isolation control signal 79-1 is low and the isolation control signal 78-1 is high, then the word line 72 is enabled by the word line driver 20. When the isolation control signal 79-1 is high and the isolation control signal 78-1 is low, then the word line in bit block 1 is isolated from the word line driver 20.

The word line 72 between bit block 1 and bit block 0 is connected to a similar isolation circuit 80 which is controlled in response to isolation control signals 78-0 and 79-0 for isolating the word line through bit block 0 from the word line through bit block 1.

The word line driver 20 includes a mirror image circuit for driving bit blocks 2 and 3 in response to the control signal 70. In addition, each of the word line isolating means for bit block 2 and bit block 3 include the isolation means 81 and 82, respectively, which are controlled in response to the isolation control signals 78-2 and 79-2, and 78-3 and 79-3, respectively.

Each of the isolation means, such as the isolation between word line of bit block 1 and the word line driver 20 includes a word line up/down driver corresponding to block 27 in FIG. 1. The word line up/down driver includes a P-channel CMOS transistor 85 having a source connected to $V_{CC}$ and a drain connected to the word line 72, an N-channel CMOS transistor 86 having a source connected to ground and a drain connected to a source of a second channel CMOS transistor 87. The gates of the transistors 86 and 85 are connected to a word line pull-up/pull-down control signal 88-1. The N-channel CMOS transistor 87 having its source connected to the drain of transistor 86 and its drain connected to the word line 72 is controlled at its gate by the isolation control signal 79-1.

During normal operation, the isolation control signal 79-1 is normally low, disabling transistor 87 and the pull-up/pull-down signal 88-1 is normally high disabling transistor 85 so that the word line pull-up/pull-down driver has no effect on the word line during normal operation. When the word line isolation control signal 79-1 goes high, transistor 87 is turned on which discharges the word line 72 across bit block B1. The pull-up/pull-down control signal 88-1 is pulsed low in order to charge up the word line across bit block B1 when desired. Accordingly, for bit blocks that are not desired to be reset, when the isolation means operates to isolate the word line across the bit block from adjacent bit blocks, it also serves to pull-down the word line disabling access to the bit block.

As before, the circuit in FIG. 3 shows the word line pull-up/pull-down circuits for each of the bit blocks, including the word line up/down driver 89 for bit block 0 which is controlled in response to the up/down driver signal 88-0; the word line up/down driver 90 for bit block 2 which is controlled in response to the word line up/down signal 88-2; and the word line up/down driver 91 which is controlled in response to the word line up/down signal 88-3.

FIG. 4 is a block diagram of the reset control circuitry 12 for the embodiment shown in FIG. 1. As discussed above, the reset control circuitry 12 receives as inputs the reset signal on line 13 and the data input signals D1–D4 across lines 14. The reset signal is received through buffer and chip enable circuit 101. Other inputs to the buffer and chip enable circuit 101 are control signals across line 11 from the enable logic 10 which are true when chip select is low, and write enable and output enable are high, indicating that the chip has been selected and the write and output enables are disabled. The output of the buffer and chip enable circuit is provided through a buffer 102 to a charging clock after reset and buffer circuit 103 which is connected to an address transition detector combiner 104. The address transition detector combiner is illustrated in FIG. 5 in more detail. In addition, the output from the buffer 102 is supplied through an additional buffer 105 to the address transition detector combiner 104 as described in FIG. 5. The address transition detector combiner 104 is signalled to disable the address decoder 7 as discussed above during reset. The reset control logic flow follows out of buffer 102 to buffer 106. The output of buffer 106 is supplied through a driver 107 to the word line isolator 108 which corresponds to the isolating means 23–26 shown in FIG. 1.

The output of buffer 106 is supplied across line 109 to bit block 0 reset enable circuit 110 and to the reset finish detecting circuits 111, 112, 113 and 114 for bit blocks 0, 3, 1 and 2, respectively. The bit block 0 reset enable circuit 110 is further connected to the input line D1 through buffer 115. The output of bit block 0 reset enable circuit is passed through a pulse stretcher 116 to buffer 117. The output of buffer 117 is supplied to the bit line B0 pull-down 118, corresponding to the B0 reset circuit 32 in FIG. 1. In addition, the output of buffer 117 is connected through a delay and buffer circuit 119 to bit line $\overline{B0}$ pull-up 119, also in the B0 reset circuit 32 in FIG. 1. The output of the $\overline{B0}$ pull-up circuit 119 is supplied through a delay circuit 120 to the reset finish detector 111 for bit block 0. The output of the reset finish detector 111 for bit block 0 is supplied through buffer 121 to the word line pull-up and pull-down circuit 122 for bit block 0, corresponding to the word line up/down driver 27 shown in FIG. 1.

In addition, the output of the reset finish detector 111 for bit block 0 is supplied through buffer 123 to sequential control circuit 124 for bit block 3, and to delay circuit 125. The output of delay circuit 125 is supplied to sequential control circuit 126 for bit block 1 and to delay circuit 127. The output of delay circuit 127 is supplied to sequential control circuit 128 for bit block 2.

The bit block 3 reset enable circuit 129 is connected to line 109 through buffer 130 to the data input D4. When bit block 3 is selected for reset as indicated by D4 and the signal on line 109, the output of the bit block 3 reset enable circuit is passed through pulse stretcher 131 and delay 132 to sequential control circuit 124. After completion of the reset for bit block 0, if any, sequential control circuit 124 generates a signal through buffer 133 that is supplied to bit line pull-down 134 for block 3. Further, the output of the buffer 133 is supplied through a delay in buffer circuit 135 to a B pull-up circuit 136 for bit block 3. The output of the pull-up circuit 136 is supplied through a delay 137 to the reset finish detector 112 indicating the finish of the reset of bit block 3.

The output of the reset finish detector 112 is supplied through buffer 138 to the word line pull-up/pull-down driver 139 for bit block 3, which corresponds to the word line up-down driver 30 of FIG. 1.

In addition, the output of the reset finish detector 112 for bit block 3 is supplied through buffer 140 to sequential control circuit 126 for bit block 1. Further, through delay means 141, the output of the buffer 140 is supplied to the sequential control circuit 128 for bit block 2.

Bit block 1 reset enable circuit 142 is connected to line 109 and through buffer 143 to the data input D2. When selected by D2, bit block 1 reset enable circuit generates a signal through pulse stretcher 144 and delay 145 to the sequential control circuit 126 for bit block 1. Upon completion of the reset of bit blocks 0 and 3, if any, the sequential control circuit 126 enables the reset of bit block 1 through buffer 146. The output of buffer 146 is supplied through the bit line pull-up 147 for bit block 1, which corresponds to the bit 1 reset driver 33 of FIG. 1. In addition, the output of buffer 146 is supplied through a delay and buffer circuit 148 to the $\overline{B}$ pull-up 149 in the bit 1 reset driver 33. The output of the pull-up circuit 149 is supplied through delay 150 to the reset finish detector 133 for bit block 1. In addition, the output of the sequential control circuit 126 for bit block B1 is supplied to the reset finish detector 113. The output of the reset finish detector 113 indicating the completion of the reset of bit blocks 0, 3 and 1, if any, generates a signal through buffer 151 through the word line pull-up and pull-down driver 152, which corresponds to the bit 1 word line up/down driver 28 of FIG. 1.

In addition, the output of the reset finish detector 113 goes through buffer 153 to the sequential control circuit 128 for bit block 2.

The bit block 2 reset enable circuit 154 receives as inputs the reset enable signal on line 109 and the data input D3 through buffer 155. When selected by D3, the bit block 2 reset enable circuit 154 supplies a signal through pulse stretcher 156 and delay means 157 to the sequential control circuit 128. The output of the sequential control circuit 128 is supplied through buffer 158 to the bit line pull-down 159 for bit block 2 and through a delay and buffer circuit 160 to bit line $\overline{B}$ pull-up 161, this corresponding to the bit 2 reset driver 34 shown in FIG. 1. The output of the pull-up driver 161 is supplied through delay means 162 to the reset finish detector 114. In addition, the output of the sequential control circuit 128 is supplied to the reset finish detector 114. The reset finish detector 114 generates a signal through buffer 163 to the word line pull-up/pull-down circuit 164 for bit block 2, this corresponding to the word line up/down driver 29 for bit block 2 shown in FIG. 1.

FIG. 5 illustrates the address transition detector combiner 104 according to the present invention. FIGS. 6A and 6B through 10A and 10B provide a logic diagram of the reset control circuit shown in FIG. 4.

The address transistion detector combiner 104 in FIG. 5 illustrates the function of the reset control circuit to disable the address decoder 7 during reset. The address transition detector combiner includes a plurality of input transistors, labeled generally by reference number 500, that are respectively enabled in response to a transition of an address signal within the address decoder 7. An address transition detector disable transistor 501 is included connected between a common source node 502 of the plurality of input transistors 500 and ground. An address transition detector disable signal 503 is generated by the reset control logic 12 through the charging clock after reset and buffer circuit 103 described in detail with reference to FIG. 6A. In addition, the address transition detector combiner includes a driver 504 for charging node 505 in response to control signal 506 when none of the input transistors 500 supplies a discharging path. An additional discharging transistor 507 is included according to the present invention which receives a discharge control signal 508 from a charging clock after reset and buffer circuit to enable the address transition detector combiner circuit after reset. Node 505 supplies signal 53 to the bit line pull-up and equalizer circuit 50-0 through 50-3. In addition, through inverter 509, the equalizer signal 57 is supplied from node 505.

The signal 503 supplied from buffer 105 and the signal 508 supplied from buffer 228 operate to disable the address transition detector combiner 104 by turning off transistor 501. The signal on line 57 is high and on line 53 is low. The signal on line 57 is high, the equalizer transistor 56, as illustrated in FIG. 2, is turned off and the pull-up transistors 52 and 54 are turned off by a low signal on line 53. Therefore, the pull-up and equalizing circuit 50-0 through 50-3 are disabled during reset.

FIGS. 6A and 6B illustrate the first section of the logic diagram of the reset control circuitry 12 illustrated in FIG. 4. The reset input is provided at 200 and is supplied through the buffer and chip enable circuit 101 which includes buffers 201, 202 and 203. The output of buffer 203 is supplied to NAND gate 204 which receives as its inputs a signal that is high when chip select is low and write enable and output enable are high. The output of the buffer and chip enable circuit 101 is supplied through buffer 102 to buffer 106, buffer 105 and the charging clock after reset in buffer circuit 103. Buffer 106 generates its output signal on line 109 and is supplied to the driver 107. The driver 107 through inverters 205 and 206 generates a low signal on line 78-0 and a high signal on 79-0. Similarly, through inverters 207 and 208 a low signal is generated on 78-1 and a high signal is generated on 79-1; similarly, through inverters 209, 210 a low signal is generated on line 78-2 and a high signal is generated on line 79-2; and similarly through inverters 211 and 212 a low signal is generated on line 78-3 and a high signal is generated on line 79-3. The signals 78-0, 79-0 through 78-3, 79-3 operate to control the word line isolators as illustrated in FIG. 3.

The output of the buffer 105 is supplied on line 503 to the address transition detector combiner as illustrated in FIG. 5.

The output of buffer 102 is supplied to the charging clock after reset and buffer circuit 103. FIG. 6A illustrates a first part of the charging clock after reset and buffer circuit 103a. The first part of the charging clock after reset and buffer circuit 103a includes inverters 213, 214, 215, 216, 217, 218, 219 and 220. The output of inverter 214 is supplied on line 221 to the second part of the charging clock after reset and buffer circuit 103 illustrated in FIG. 6B. Likewise, the output of inverter 220 is supplied on line 222 to the second part of the charging clock after reset and buffer circuit 103 shown in FIG. 6B.

FIG. 6B illustrates the second part 103b of the charging clock after reset and buffer circuit 103. The second part 103b includes exclusive OR gate 223 receiving as inputs the signal on lines 222 and 221. The output of the exclusive OR gate 223 is supplied through inverter 224 and inverter 225 to NAND gate 226. The second input to the NAND gate 226 is generated from line 221 through inverter 227. The output of NAND gate 226 is supplied through buffer 228. The output of the buffer 228 generates a pulse on line 508 and is supplied to the address transition detection combiner illustrated in FIG. 5.

In sum, the circuits shown in FIGS. 6A and 6B generate signals for disabling the address decoder 7 and for enabling the word line isolation means for separating the bit blocks along the word lines. In addition, the signal on line 109 is provided to the circuits shown in 7A, 7B through 10A, 10B for sequentially controlling the reset of the bit blocks when reset is indicated by the signal on line 109.

Figures 7A, 7B:
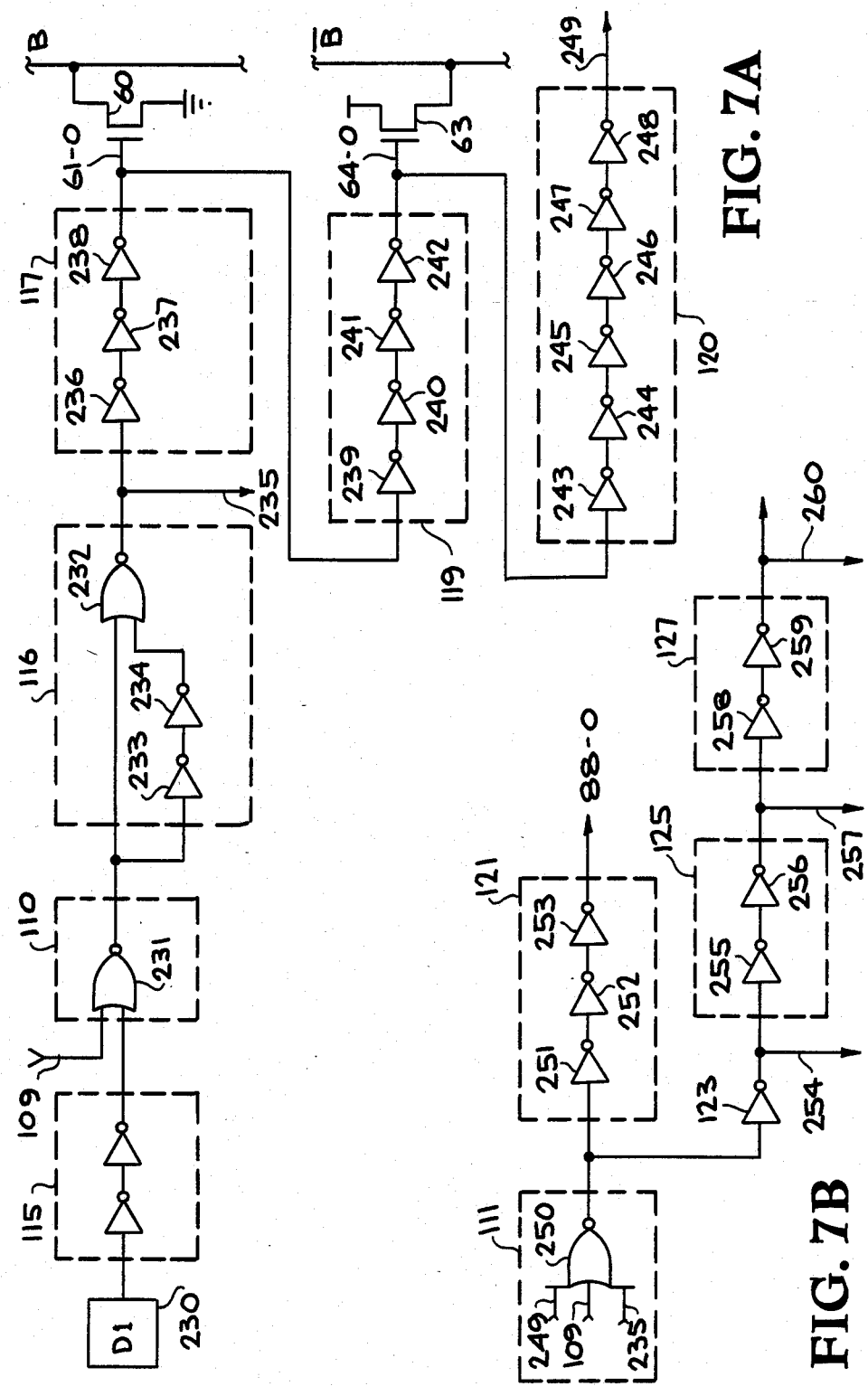
FIGS. 7A and 7B illustrate a logic diagram of a second portion of the reset control circuit receiving as an input a first input/output signal identifying a block for reset.

FIGS. 7A and 7B illustrate a portion of the reset control logic 12 used in resetting bit block 0. FIG. 7A receives input signal D1 at block 230. The input signal D1 at block 230 is supplied through buffer 115 to the bit block 0 reset enable circuit 110. The bit block 0 reset enable circuit 110 includes a NOR gate 231 which receives as one input the signal on line 109 and as the other input the output of buffer 115. The output of NOR gate 231 is supplied to the pulse stretcher 116 which comprises NOR gate 232 which receives as one input directly the output of NOR gate 231 and as another input, the output of NOR gate 231 supplied through the delay buffers 233 and 234. The output of the NOR gate 232 generates a signal on line 235 which is supplied to the portion of the circuit shown in FIG. 7B. In addition, it is supplied through the buffer 117 made up of three stages 236, 237 and 238. The output of the buffer 117 is supplied as signal 61-0 to the bit 0 pull-down driver 60 as shown in FIG. 2. In addition, the output of the buffer 117 is supplied through delay and buffer circuit 119 which includes four stages 239, 240, 241 and 242 as the signal 64-0 to the complement bit 0 pull-up driver 32, as illustrated in FIG. 2.

The output of the delay and buffer circuit 119 is supplied through a 6-stage delay 120 including stages 243, 244, 245, 246, 247 and 248. The delay circuit 120 supplies an output signal on line 249 to the portion of the circuit shown in FIG. 7B.

FIG. 7B picks up in the control logic for resetting bit block 0 with the reset finish detector 111 which includes NOR gate 250. The inputs to NOR gate 250 are the signals on lines 109, 235 and 249 as supplied from FIGS. 6A and 7A. The output of the reset finish detector 111 is supplied through buffer 121 which includes three stages 251, 252 and 253. The output of the buffer 121 is supplied as signal 88-0 to the bit 0 word line 89 shown in FIG. 3.

In addition, the output of the reset finish detector is supplied through buffer 123 to generate a signal on line 254. In addition, the signal on line 254 is supplied through a delay buffer 125 including two stages 255, 256 to generate a signal on line 257. The signal on line 257 is supplied through delay buffer 127 including two stages 258, 259 to generate a signal on line 260. The signals on lines 254, 257 and 260 are supplied to sequential control logic shown in FIGS. 8B, 9B and 10B, respectively.

Figures 8A, 8B:
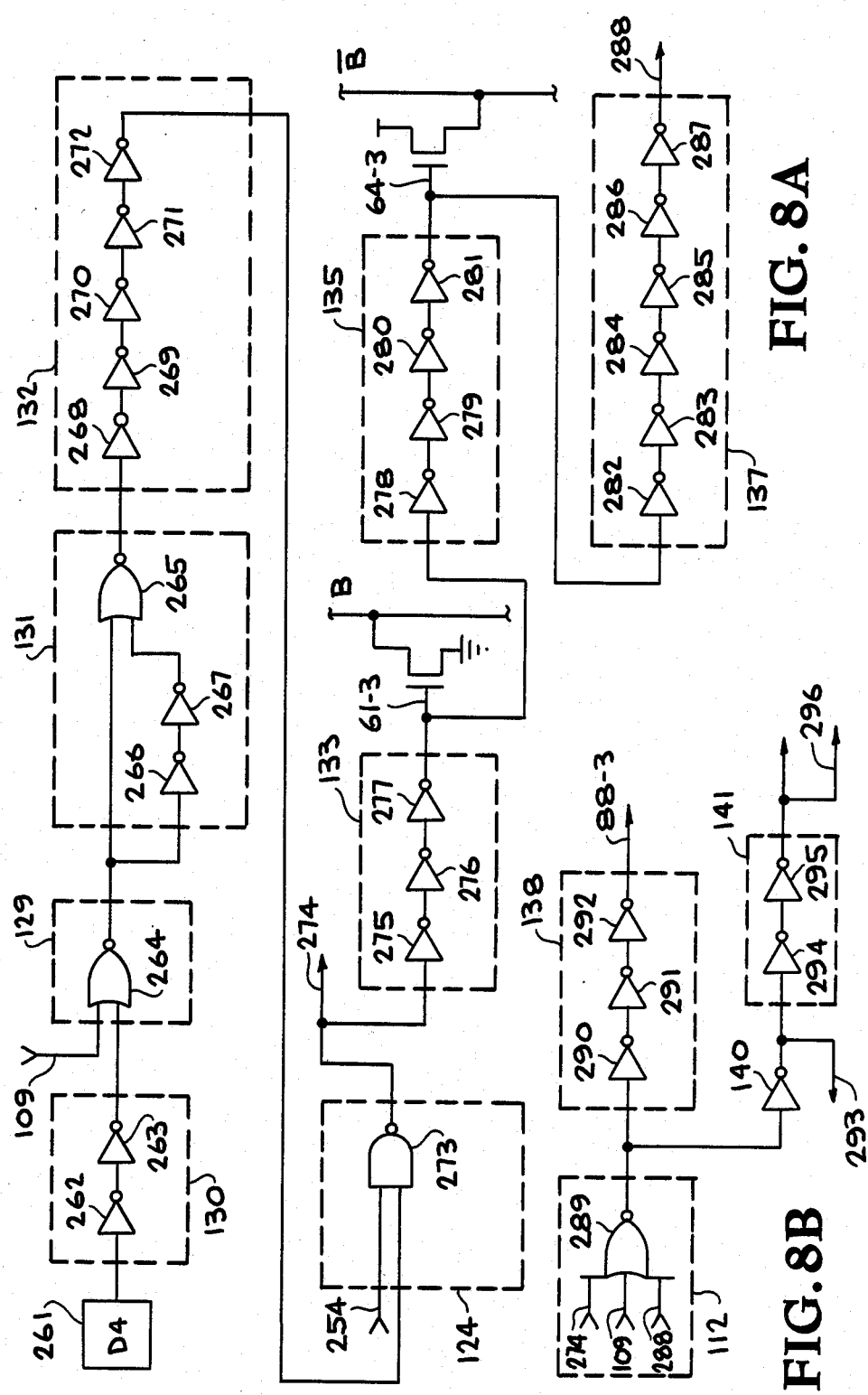
FIGS. 8A and 8B illustrate a logic diagram of a third portion of the reset control circuit receiving as an input a second input/output signal identifying a block for reset.

FIGS. 8A and 8B illustrate the reset control logic for resetting bit block 3. FIG. 8A receives as inputs the data input D4 at block 261. D4 is supplied through buffer 130 including stages 262 and 263 to the bit block 3 reset enable circuit 129. The reset enable circuit 129 includes a NOR gate 264 which receives as inputs the signal on line 109 and the output of the buffer 130. The output of the reset enable circuit 129 is supplied through pulse stretcher 131 including a NOR gate 265 receiving as inputs the output of enable circuit directly and through the delay buffers 266 and 267. The output of the pulse stretcher 131 is supplied through the delay line 132 including five delay stages 268, 269, 270, 271 and 272. The output of the delay line 132 is supplied to sequential control circuit 124.

The sequential control circuit 124 include NAND gate 273 receiving as inputs the signal on line 254 generated in FIG. 7B and the output of the delay line 132. The sequential control circuit 124 supplies a signal on line 274 which is used in reset finish detector 112 shown in FIG. 8B. In addition, the signal on line 274 is supplied through 3-stage buffer 133 including stages 275, 276 and 277. The output of the buffer 133 is supplied as signal 61-3 driving the pull-down of the bit block reset driver 35. In addition, the signal on line 61-3 is supplied through 4-stage delay and buffer circuit 135, including stages 278, 279, 280 and 281. The output of the delay and buffer circuit 135 is supplied as signal 64-3 driving the pull-up of the complement bit line in the bit block 3 reset driver 35. In addition, the signal on line 64-3 is supplied through the 6-stage delay circuit 137, including stages 282, 283, 284, 285, 286 and 287. The output of the delay circuit 137 generates a signal on line 288 that is supplied to the reset finish detector 112 of FIG. 8B.

FIG. 8B illustrates the balance of the reset control circuit for resetting bit block 3. It picks up with the reset finish detector 112 which receives as inputs the signal on line 274 and 288 generated in FIG. 8A and the signal on line 109 generated in FIG. 6A. The inputs are supplied to NOR gate 289. The output of NOR gate 289 is supplied to the buffer 138 which includes three stages 290, 291 and 292. The output of the buffer 138 generates a signal on line 88-3 driving the word line pull-up/pull-down driver 30 for bit block 3. The input of signal 88-3 is illustrated in FIG. 3.

In addition, the output of the reset finish detector is supplied through buffer 140 to generate a signal on line 293. The signal on line 293 is supplied through 2-stage delay 141 including stages 294 and 295. The output of the delay 141 is supplied as a signal on line 296. The signals on lines 293 and 296 are supplied as control signals to the sequential control logic controlling the reset of bit blocks 1 and 2 illustrated in FIGS. 9A and 10A, respectively.

FIGS. 9A and 9B illustrate the portion of the reset control circuit used to reset bit block 2. FIG. 9A receives the data input D2 at block 297 as input. The data input D2 is supplied through buffer 143 which includes stages 298 and 299. The output of the buffer 143 is supplied to the bit block 1 reset enable circuit 142 which includes a NOR gate 300. The inputs to NOR gate 300 are a signal on line 109 generated in FIG. 6A and the output of the buffer 143. The output of the NOR gate 300 is supplied through pulse stretcher 144, which includes NOR gate 301 having the output of NOR gate 300 as one input and the output of NOR gate 300 supplied through delay stages 302 and 303 as a second input. The output of the pulse stretcher 144 is supplied through a delay circuit 145 including 7 stages, 304, 305, 306, 307, 308, 309 and 310. The output of the delay circuit 145 is supplied to the sequential control logic 126 for bit block 1 which includes NAND gate 311. The inputs to NAND gate 311 include the signal generated on line 257 as shown in FIG. 7B and the signal generated on line 293 as shown in FIG. 8B. The third input to NAND gate 311 is the output of the delay circuit 145.

The output of the NAND gate 311 supplies the signal on line 312 which connects to the reset finish detector 113 shown in FIG. 9B. In addition, the signal on line 312 is supplied through the buffer 146 which includes stages 313, 314 and 315. The output of the buffer 146 is supplied a signal on line 61-1 which drives the pull-down driver for the bit 1 reset driver 33. In addition, the signal on line 61-1 is supplied through delay and buffer circuit 148 which includes 4 stages 316, 317, 318 and 319. The output of the delay and buffer circuit 148 supplies a signal on line 64-1 driving the complement bit line pull-up driver in the bit 1 reset driver 33. In addition, the signal on line 64-1 is supplied through the 6-stage delay circuit 150 including stages 320, 321, 322, 323, 324 and 325. The output of the delay and buffer circuit 150 is supplied on line 326 which connects to the reset finish detector 113 shown in FIG. 9B.

FIG. 9B continues in the reset control logic for resetting bit block 1 beginning with the reset finish detector 113. The reset finish detector 113 includes NOR gate 327 which receives as inputs the signals on lines 312 and 326 as generated in FIG. 9A and the signal on line 109 as generated in FIG. 6A. The output of the NOR gate 327 is supplied through buffer 151 which includes 3 stages 328, 329 and 330 to supply a signal on line 88-1 driving the word line up/down driver 28 as shown in FIG. 1 and as connected as illustrated in FIG. 3. In addition, the output of the NOR gate 327 is supplied through buffer 153 to supply a signal on line 331 for supply to the sequential control logic for resetting bit block 2 as illustrated in FIG. 10A.

Figures 10A, 10B:
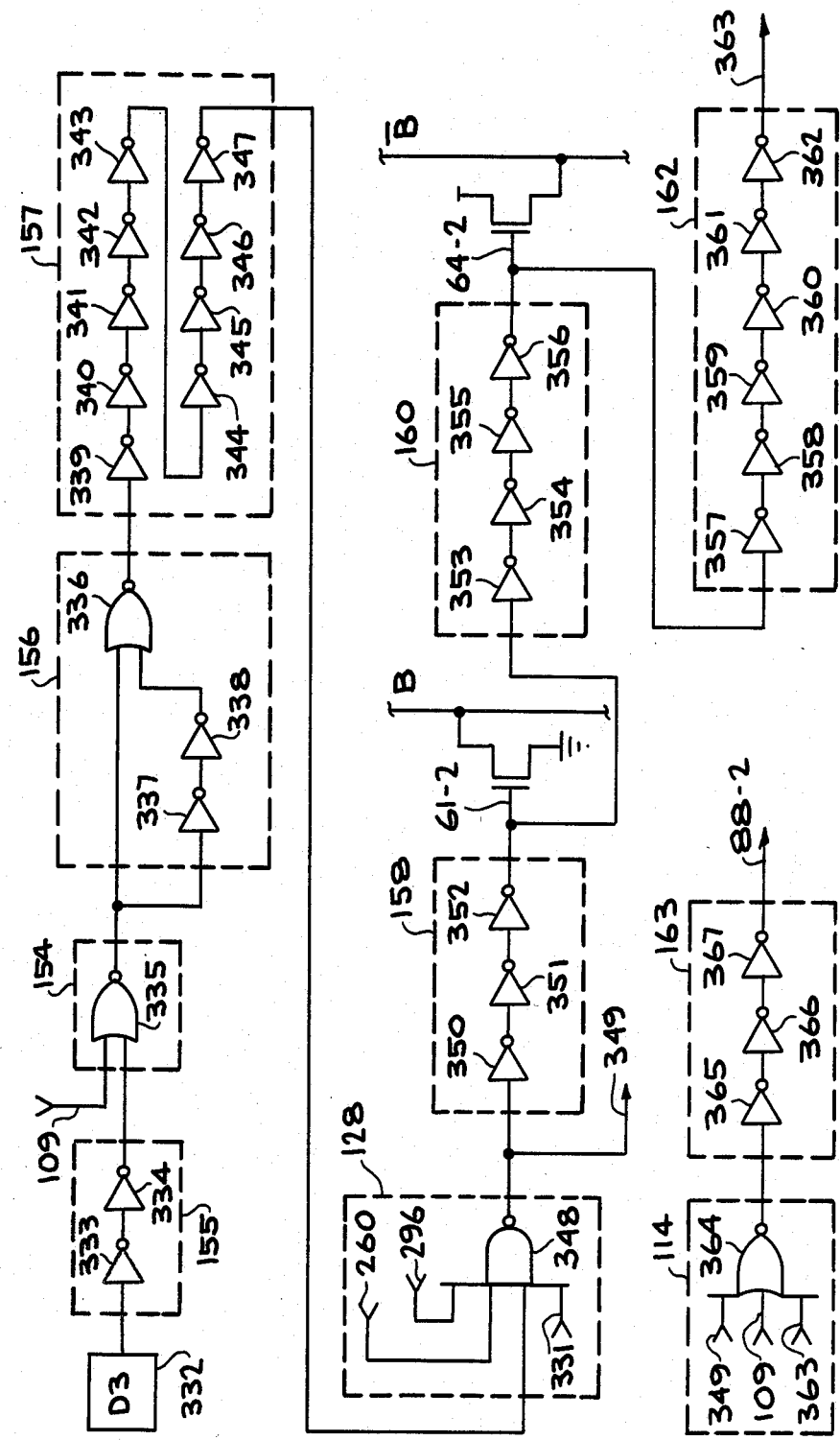
FIGS. 10A and 10B illustrate a logic diagram of a fifth portion of the reset control circuit receiving as an input a fourth input/output signal identifying a block for reset.

FIGS. 10A and 10B illustrate the balance of the reset control logic for resetting bit block 2. FIG. 10A receives as input the data input D3 at block 332. The data input D3 is supplied through buffer 155 which includes two stages, 333 and 334. The output of the buffer 155 is supplied to the bit block 2 reset enable circuit 154 which includes a NOR gate 335. The inputs to NOR gate 335 include a signal supplied on 109 from FIG. 6A and the output of the buffer 155. The output of the bit block 2 reset enable circuit 154 is supplied through pulse stretcher 156. The pulse stretcher 156 includes NOR gate 336 which receives as inputs the output of NOR gate 335 directly and the output of NOR gate 335 is supplied through delay stages 337 and 338. The output of the pulse stretcher 156 is supplied through delay circuit 157. Delay circuit 157 includes 9 stages 339, 340, 341, 342, 343, 344, 345, 346 and 347. The output of the delay circuit 157 is supplied to the sequential control logic 128 for bit block 2. The sequential control logic 128 for bit block 2 includes NAND gate 348 which receives as one input the output of delay circuit 157 and as other inputs the signal supplied on lines 260, 296 and 331 as generated in FIGS. 7B, 8B and 9B, respectively.

The output of the sequential control logic 128 is supplied as a signal on line 349 to the reset finish detecting circuit 114 shown in FIG. 10B. In addition, the signal on line 349 is supplied through buffer 158 which includes three stages 350, 351 and 352. The output of the buffer 158 is supplied as a signal on line 61-2 driving the pull-down driver of bit 2 reset driver 34 as shown in FIG. 1. Further, the signal on line 61-2 is supplied through delay and buffer circuit 160, which includes 4 stages 353, 354, 355 and 356. The output of the delay and buffer circuit 160 supplies a signal on line 64-2 driving the pull-up transistor for the complement bit line in the bit 2 reset driver 34. In addition, the signal on line 64-2 supplied through 6-stage delay circuit 162, including stages 357, 358, 359, 360, 361 and 362. The output of the delay and buffer circuit 162 is supplied on line 363 to the reset finish detector 114 shown in FIG. 10B.

FIG. 10B completes the reset control logic, picking up with the reset finish detector 114 from bit block 2. The reset finish detector 114 for bit block 2 includes a NOR gate 364 receiving as inputs the signals supplied on lines 349 and 363 as generated in FIG. 10A and the signal supplied on line 109 as generated in FIG. 6A. The output of the reset finish detector 114 is supplied through 3-stage buffer circuit 163, including stages 365, 366 and 367. The output of the buffer circuit 163 is supplied as a signal on line 88-2 driving the bit 2 word line up/down driver 29, the connection being shown in FIG. 3.

The reset control circuitry illustrated in FIGS. 6A, 6B through 10A, 10B implement the reset process outlined above.

It should be appreciated that in addition to providing reset selectable along memory block boundaries, the control circuit temporally staggers the reset of individual blocks. This can be seen in the differing lengths of buffer 117 in FIG. 7A, delay line 132 in FIG. 8A, delay line 145 in FIG. 9A, and delay line 157 in FIG. 10A, providing temporal staggering of the bit line pull-up and pull-down surges. The sequential control logic blocks 124, 126 and 128 provide additional protection and assure a preselected sequence of reset.

CONCLUSION

The preferred implementation has been illustrated providing for selectable reset along bit block boundaries in a static RAM. The selectable reset drives the selected bit block's true bit lines to 0 and complement bit lines to 1.

Further, the organization of the arrays of memory units in the storage blocks can be altered as suits a user of the present invention to meet the needs of a particular application.

It should be appreciated that the reset apparatus according to the present invention can be adapted to a wide variety of memory devices other than static random access memories.

The present invention has particular application as a memory device for storing control tags in data processing machines. The capability of selectively resetting a bit block in a list of tag words provides much flexibility to a system programmer. For instance, a system designer may desire to reset a given bit in a tag array to a selected value to eliminate the need of multiple accesses to the tag array to update all the tags in the array. A cache is a performance-related level in the memory hierarchy which serves as a buffer between the CPU and the main memory. The Cache consists of a tag RAM, a data RAM and a cache controller. The tag buffer performs a test to see if the needed information, such as page address, data or instruction is currently stored in the data RAM. The content of the tag RAM consists of tag bits and attribute bits. One of the attribute bits is a valid bit. During context switch (in a multiprocessing environment), the valid bit is reset to LOW which indicates that the content of the data RAM is invalid. In some system applications, a parity function is implemented on the Tag RAM. The parity bit in the Tag RAM could be reset when the whole RAM array is reset to LOW so that there is no parity error (which might cause a system halt) after reset. Other users might want to switch only the valid bit so that the content of the Tag RAM is preserved for diagnostic or other reasons. There are other users who might want to reset other status bits besides the valid bit. The reset function of the present invention offers unique solutions to these applications.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

We claim:
1. An apparatus for storing data for read and write access receiving reset control signals identifying at least one block for reset, comprising:
   a plurality of storage blocks, each block including an array of memory units for storing a unit of data;
   reset control means, coupled to receive the reset control signals, for generating a block reset signal for the at least one block identified by the reset control signals; and
   means, coupled to the memory units in each block and to receive the block reset signal, for resetting memory units in the at least one identified block to a reset value.

2. The apparatus of claim 1, wherein the reset control signals identify a plurality of blocks for reset, and said reset control means includes means for temporally staggering the generation of block reset signals for individual storage blocks.

3. The apparatus of claim 1, wherein the array of memory units in the plurality of storage blocks is organized into a plurality of rows and columns, the memory units in each row being connected by a word line through the plurality of blocks to a word line driver;

the memory units in each column being connected by a bit line to an output buffer;

the word line comprising means, responsive to the word line driver, for enabling memory units along the word line to supply the respective units of data to the bit lines; and wherein the means for resetting the identified block of memory to a reset value includes isolating means, coupled to the word lines between individual storage blocks, for isolating the word lines through the individual storage blocks during reset.

4. The apparatus of claim 3, wherein said means for resetting the identified block of memory to a reset value includes a driving means, connected to receive the block reset signals, for enabling and disabling sections of the word line through an identified storage block for reset.

5. The apparatus of claim 4, wherein said means for resetting the identified block of memory to a reset value includes:

means connected to the bit lines of the respective storage blocks for resetting the memory units along the bit lines to the reset value in response to the reset control signals.

6. The apparatus of claim 1, wherein the apparatus for storing data is a static random access memory device.

7. The apparatus of claim 1 or 5, further including: means for dynamically selecting the reset value.

8. The apparatus of claim 1, wherein the data includes a list of control tags.

9. An apparatus for storing data for read and write access including a plurality of memory blocks, each block including an array of bit storage units, wherein an improvement comprises:

reset control means, coupled to receive a reset signal and reset block select signal identifying at least one of the plurality of blocks, for generatng a block reset signal; and means, coupled to the arrays of bit storage units in the plurality of blocks and to receive the block reset signal, for resetting the array of memory units in the at least one block identified by the block select signal to a reset value.

10. The improvement of claim 9, wherein said reset control means includes means for temporally staggering the generation of block reset signals for individual storage blocks.

11. The improvement of claim 9, wherein the array of memory units in the plurality of storage blocks is organized into a plurality of rows and columns, the memory units in each row being connected by a word line through the plurality of blocks to a word line driver;

the memory units in each column being connected by a bit line to an output buffer;

the word line comprising means, responsive to the word line driver, for enabling memory units along the word line to supply the respective units of data to the bit lines; and wherein the means for resetting the identified block of memory to a reset value includes isolating means, coupled to the word lines between individual storage blocks, for isolating the word lines through the individual storage blocks during reset.

12. The improvement of claim 11, wherein said means for resetting the identified block of memory to a reset value includes a driving means, connected to receive the block reset signals, for enabling and disabling sections of the word line through an identified storage block for reset.

13. The improvement of claim 12, wherein said means for resetting the identified block of memory to a reset value includes:

means connected to the bit lines of the respective storage blocks for resetting the memory units along the bit lines to a reset value in response to the reset control signals.

14. The improvement of claim 9, wherein the apparatus for storing data is a static random access memory device.

15. The apparatus of claim 9 or 13, further including: means for dynamically selecting the reset value.

16. The apparatus of claim 9, wherein the data includes a list of control tags.

17. An apparatus for storing data for random read and write access, comprising:

a plurality of storage blocks, each block including an array of memory units storing a unit of data organized into a plurality of rows and columns, the memory units in each row being connected by a word line through the plurality of blocks to a word line driver, the memory units in each column being connected by a bit line to an output buffer, the word line comprising means responsive to the word line driver for enabling memory units along the word line to supply the respective units of data to the bit lines;

reset control means, coupled to receive a reset signal and a reset block select signal identifying at least one of the plurality of blocks, for generating a block reset signal; and means, coupled to the arrays of bit storage units in the plurality of blocks and to receive the block reset signal, for resetting the array of memory units in the identified blocks to a reset value including, isolating means, coupled to the word lines between individual storage blocks, for isolating the word lines through the individual storage blocks during reset, driving means, connected to receive the block reset signal and to the word lines in individual blocks, for enabling and disabling isolated sections of the word line through an identified storage block, and resetting means, connected to receive the block reset signal and to the bit lines in the plurality of blocks, for driving the memory units to the reset value.

18. The apparatus of claim 17, wherein the read and write access is controlled by addresses identifying data fields including a numeral N data units and the plurality of storage blocks includes one storage block for each of the N units in the data field.

19. The apparatus of claim 17, further including: means for dynamically selecting the reset value.

20. The apparatus of claim 17, wherein the data includes a list of control tags.

* * * * *